US011035771B2

(12) United States Patent
Niedermayer

(10) Patent No.: US 11,035,771 B2
(45) Date of Patent: Jun. 15, 2021

(54) MEASUREMENT SYSTEM WITH RESONANT SENSORS AND METHOD FOR THE OPERATION OF A RESONANT SENSOR

(71) Applicant: Alexander Niedermayer, Linz (AT)

(72) Inventor: Alexander Niedermayer, Linz (AT)

( * ) Notice: Subject to any disclaimer, the term of this patent is extended or adjusted under 35 U.S.C. 154(b) by 114 days.

(21) Appl. No.: 14/957,032

(22) Filed: Dec. 2, 2015

(65) Prior Publication Data

US 2016/0161388 A1 Jun. 9, 2016

(30) Foreign Application Priority Data

Dec. 3, 2014 (AT) .............................. A 50879/2014

(51) Int. Cl.

| | |
|---|---|
| ***G01N 11/16*** | (2006.01) |
| ***G01N 9/00*** | (2006.01) |
| ***G01N 29/34*** | (2006.01) |
| ***G01N 29/44*** | (2006.01) |
| ***G01N 29/036*** | (2006.01) |
| ***G01R 23/07*** | (2006.01) |

(52) U.S. Cl.
CPC ........... *G01N 11/16* (2013.01); *G01N 29/036* (2013.01); *G01N 29/34* (2013.01); *G01N 29/348* (2013.01); *G01N 29/4472* (2013.01); *G01R 23/07* (2013.01); *G01N 2009/006* (2013.01)

(58) Field of Classification Search
CPC ......................... G01N 2009/006; G01N 11/16
See application file for complete search history.

(56) References Cited

U.S. PATENT DOCUMENTS

| | | | | |
|---|---|---|---|---|
| 5,302,878 | A * | 4/1994 | Soucemarianadin .. | G01N 11/16 310/323.21 |
| 5,334,303 | A * | 8/1994 | Muramatsu ............ | G01N 11/16 204/400 |
| 6,765,392 | B1 * | 7/2004 | Jakoby ................... | G01D 5/243 324/633 |
| 8,020,432 | B1 * | 9/2011 | Ballato .................. | G01N 11/16 73/54.41 |
| 9,535,087 | B2 * | 1/2017 | Jesse ...................... | G01Q 60/32 |
| 2005/0052813 | A1 * | 3/2005 | Kobayashi ............... | G01N 5/02 361/143 |
| 2009/0216467 | A1 * | 8/2009 | Andle .................... | G01N 9/002 702/54 |
| 2010/0005865 | A1 * | 1/2010 | Miura .................... | G01N 11/16 73/54.41 |
| 2011/0036151 | A1 * | 2/2011 | Andle .................... | G01N 9/002 73/54.41 |
| 2017/0030870 | A1 * | 2/2017 | Dual ...................... | G01N 11/16 |

* cited by examiner

*Primary Examiner* — Herbert K Roberts
(74) *Attorney, Agent, or Firm* — Murphy, Bilak & Homiller, PLLC

(57) ABSTRACT

A method to operate a resonator is provided herein. As illustrated with an example, the resonator is excited by means of a periodic excitation signal with an integer number of at least two signal components with one specified frequency each. A response signal of the resonator is determined at the specified frequencies of the at least two signal components of the excitation signal. Eventually, parameters of a model illustrating the behavior of the resonator as a function of the response signal are calculated based on the response signal.

18 Claims, 3 Drawing Sheets

Mechanical Resonators

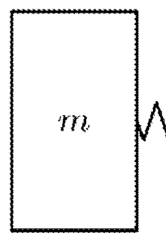

$$\frac{1}{k}\ddot{F} + \frac{1}{d}\dot{F} + \frac{1}{m}F = \dot{v}$$

$$Z_{\mathrm{R}}(\omega) = \frac{F}{v} = \frac{1}{\frac{1}{d} + \frac{j\omega}{k} + \frac{1}{j\omega m}}$$

$$Z_{\mathrm{R}}(\omega) = \frac{d}{1 + jQ\left(\frac{\omega}{\omega_r} - \frac{\omega_r}{\omega}\right)}$$

$$\omega_r = \sqrt{\frac{k}{m}}$$

$$Q = \omega_r \frac{d}{k}$$

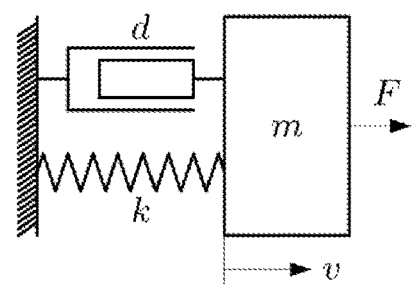

$$m\ddot{v} + d\dot{v} + kv = \dot{F}$$

$$Y_{\mathrm{R}}(\omega) = \frac{v}{F} = \frac{1}{d + \frac{k}{j\omega} + j\omega m}$$

$$Y_{\mathrm{R}}(\omega) = \frac{d^{-1}}{1 + jQ\left(\frac{\omega}{\omega_r} - \frac{\omega_r}{\omega}\right)}$$

$$\omega_r = \sqrt{\frac{k}{m}}$$

$$Q = \omega_r \frac{m}{d}$$

Electrical Resonators

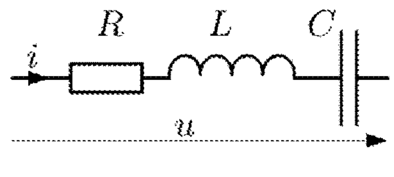

$$L\ddot{i} + R\dot{i} + \frac{1}{C}i = \dot{u}$$

$$Y_{\mathrm{R}}(\omega) = \frac{i}{u} = \frac{1}{R + \frac{1}{j\omega C} + j\omega L}$$

$$Y_{\mathrm{R}}(\omega) = \frac{R^{-1}}{1 + jQ\left(\frac{\omega}{\omega_r} - \frac{\omega_r}{\omega}\right)}$$

$$\omega_r = \frac{1}{\sqrt{LC}}$$

$$Q = \omega_r \frac{L}{R}$$

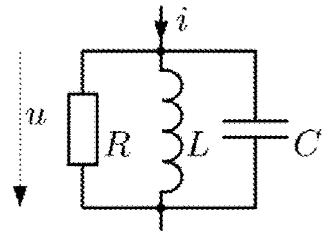

$$C\ddot{u} + \frac{1}{R}\dot{u} + \frac{1}{L}u = \dot{i}$$

$$Z_{\mathrm{R}}(\omega) = \frac{u}{i} = \frac{1}{\frac{1}{R} + j\omega C + \frac{1}{j\omega L}}$$

$$Z_{\mathrm{R}}(\omega) = \frac{R}{1 + jQ\left(\frac{\omega}{\omega_r} - \frac{\omega_r}{\omega}\right)}$$

$$\omega_r = \frac{1}{\sqrt{LC}}$$

$$Q = \omega_r RC$$

FIG. 1

MEASUREMENT SYSTEM WITH RESONANT SENSORS AND METHOD FOR THE OPERATION OF A RESONANT SENSOR

PRIORITY CLAIM

This application claims priority to Austrian Patent Application No. A50879/2014 filed on 3 Dec. 2014, the content of said application incorporated herein by reference in its entirety.

TECHNICAL FIELD

This invention relates generally to the field of metrology and signal processing and more particularly to the excitation of resonant sensors and the evaluation of the resulting response signals.

BACKGROUND

Resonant sensors can be used for measuring a great variety of physical parameters. All types of resonant sensors share one common quality, i.e. the measured variable(s) affect(s) at least one of the following parameters: the resonance frequency (f), the quality (Q) factor or the damping (D), where Q=1/D. In other words, the frequency-dependent, complex impedance of the sensor and/or the transfer function are a function of the measured variable(s). The measurement procedure with such a sensor comprises the excitation of the resonator and the evaluation of the resulting response signal.

(Micro) mechanical or electromechanical resonators can for instance be used to determine viscosity or density of fluids, but this is merely one of a multitude of possible applications. Apart from mechanical/electromechanical resonant circuits, it is also possible to build up sensors by means of electrical resonators.

The physical properties of many resonators can be described adequately using the damped harmonic oscillator model (FIG. 1), provided that further elements are added, as is the case with a common model for quartz crystal resonators (Butterworth—Van Dyke Model, see FIG. 2). In this particular case the model comprises a series resonant circuit paralleled by an additional capacitive element CO representing the capacitance formed by the electrodes on the quartz surface.

These additional elements (often called spurious or parasitic) are used to model not only capacitive and inductive coupling, but also electrical properties of used materials and similar effects or their combinations. Although there are configurations with weak damping (high Q-factor), where the influence of these parasitic effects can often be neglected without degrading the measurement results significantly, these effects may show frequency-dependent behavior and be influenced by physical properties (others than the desired measurands), introducing cross sensitivities that may degrade the performance of a measurement system significantly. To avoid (or at least reduce) these interferences it is recommendable to analyze the resonator behavior in a certain range in the vicinity of the resonance frequency in order to determine the parasitic effects in addition to the behavior of the damped harmonic oscillator.

To evaluate the response of resonant sensors, various methods are used.

One approach is used in oscillator and phase locked loop configurations, where the excitation signal is tuned to keep the resonator on a specific operating point (ideally the resonance frequency) of its frequency response function. In this configuration the sensor is continuously excited and operated in steady state, hence the settling time of the resonator has only little effect on the achievable measurement rate. As the sensor behavior is only evaluated in one specific operating point, this evaluation method is unsuitable for applications with dominant or varying parasitic effects.

Another method, commonly used with network analyzer instruments, is to acquire the frequency response of the resonator in a certain range in the vicinity of the resonance frequency by sweeping or stepping the excitation frequency. The additional information that is gathered from the frequency response function can be used to separate resonance behavior from parasitic sensor effects.

With respect to the achievable measurement rate, the time constant of the resonator has a significant effect in case of this measurement method: either the obtained frequency response function is affected by the transient behavior of the system or the sweeping or stepping is executed so slowly, that the transients have sufficiently decayed. However, this measurement method is comparably slow. Furthermore, as a sweep is a change of frequency over time, it may happen that, if physical parameters change over time, they cannot be distinguished from frequency dependent effects. This may cause severe measurement errors.

Further, it is possible to obtain the desired parameters of the resonance by analyzing the transient behavior of the sensor. Therefor the resonator is excited with a time-limited signal like a pulse. The measurement rate that can be achieved with this method is significantly influenced by the time constant of the resonating system. Furthermore, the driving amplitude of the excitation has to be increased with decreasing excitation time to ensure a sufficient energy level in the resonator which is necessary for an adequate signal to noise ratio of the response signal.

As the sensor behavior is only evaluated in one specific operating point, this evaluation method is unsuitable for applications with dominant or varying parasitic effects.

Notwithstanding the above, there remains a need in the art for an evaluation method for resonant sensors which coincidently offers a high signal to noise ratio, a high measurement speed, and minimal impact of parasitic influences on the measurement results.

SUMMARY

The present invention meets the above need by providing a method to evaluate the frequency response function of a resonator at multiple frequencies while maintaining a steady state oscillation.

In the following, a method for operating a resonant sensor is outlined. According to an example of the invention, a resonant sensor is excited with a periodic excitation signal comprising a finite number of least two signal components each with a specified frequency. The response signal of the resonant sensor is evaluated at the specified frequencies of the signal components of the excitation signal Finally, the parameters of a resonator model are calculated upon the obtained data points.

Furthermore, a measurement setup is described. According to another example of the invention, the setup comprises a resonant sensor and a signal processing unit coupled to the resonator. The signal processing unit is designed to excite the resonator with a periodic excitation signal comprising a finite number of at least two signal components, each with a specified frequency. Furthermore, the signal processing unit is designed to evaluate the response signal of the resonator at the specified frequencies of the signal components in the excitation signal. Finally, the parameters of a resonator model are calculated upon the obtained data points.

In particular, a resonant sensor for viscosity and density measurements is described. Typically, such a sensor comprises an electromechanical (e.g. a piezoelectrical) resonator. When exposed to a fluid the resonator changes its resonant behavior (resonance frequency and quality factor) depending on the viscosity and density of the fluid.

BRIEF DESCRIPTION OF THE DRAWINGS

The invention is outlined based on the examples shown in the figures below. The drawings are not necessarily to scale and the invention is not limited to the aspects shown. Rather, it is intended to illustrate the underlying principles of the invention. In the figures, the same designations are used for identical or similar components with identical or similar meaning.

FIG. 1 illustrates examples of damped harmonic oscillator models that can be used to describe the behavior of resonant sensors.

DETAILED DESCRIPTION

In FIG. 1 various damped harmonic oscillators are shown: mechanical resonators typically consist of a spring (stiffness k) and a mass (m) and some kind of damper (d) converting kinetic into thermal energy, electrical resonators of resistance (R), Capacitance (C) and Inductance (L). Typically, the state-space variables of mechanical resonators are force and velocity. For electrical resonators, however, voltage and current are commonly used. The first and second derivative (with respect to time) of a symbol is denoted with one and two points above the symbol. Due to the systematic equivalence of the different resonator models, the differential equations as well as the frequency response functions of the systems are equivalent. The behavior of these resonators can be described with the parameters resonance frequency ($f_r$) and quality factor (Q).

Figure 2:
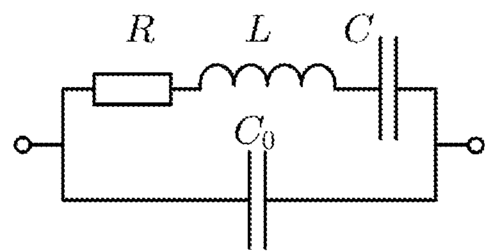
FIG. 2 illustrates a Butterworth—Van Dyke model of a resonant sensor (e.g. of a quartz crystal resonator). The model of a damped harmonic oscillator is enhanced with an additional element (CO) representing the capacitance formed by the sensor electrodes.

For many resonators the simple model of a harmonic oscillator has to be enhanced with additional elements for proper representation of the physical behavior. For instance a common model for quartz crystal resonators (Butterworth—Van Dyke Modell, see FIG. 2) comprises a series resonant circuit paralleled by an additional capacitive element CO representing the capacitance formed by the electrodes on the quartz surface.

Figure 3:
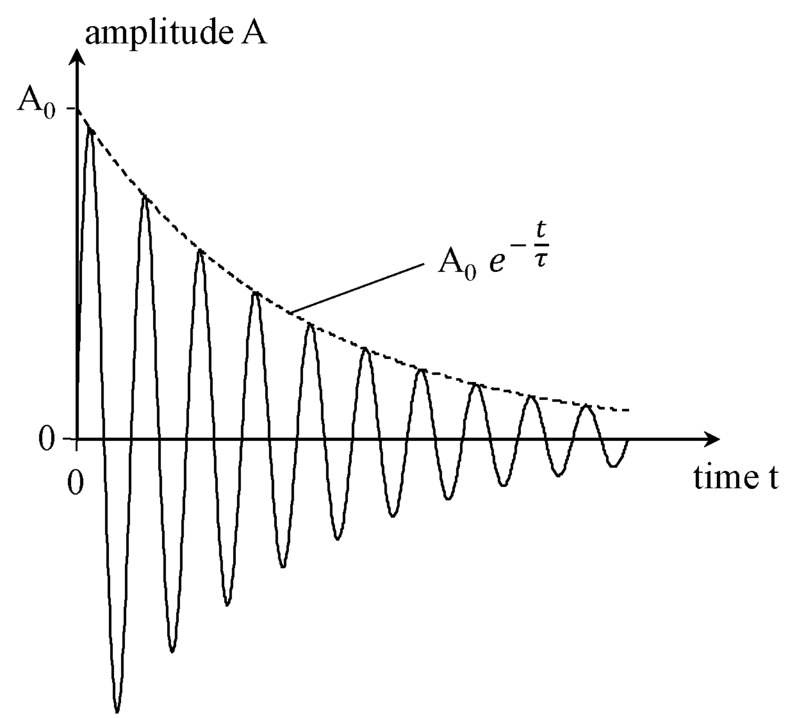
FIG. 3 illustrates an impulse response of a damped harmonic oscillator. The oscillation decays with a time constant of $\tau=2Q/\omega_r$.

FIG. 3 shows the example of an impulse response of an oscillator to illustrate the effect of the time constant $\tau=2Q/\omega_r$. describing the decay rate of the system. To obtain the desired parameters of a resonance (for instance $f_r$, Q, and parasitic parameters) it is sufficient to determine a certain number (depending on the complexity of the model) of data points of its frequency response.

The invention relates to a method for determining the frequency response function of a resonator at a finite number of different frequencies while continuously operating the resonator. The spectrum is determined without changing the excitation signal, the resonator remains in steady state. The settling time as a result of the time constant T of the resonator hence is of minor importance regarding the achievable measurement rate.

Figure 4:
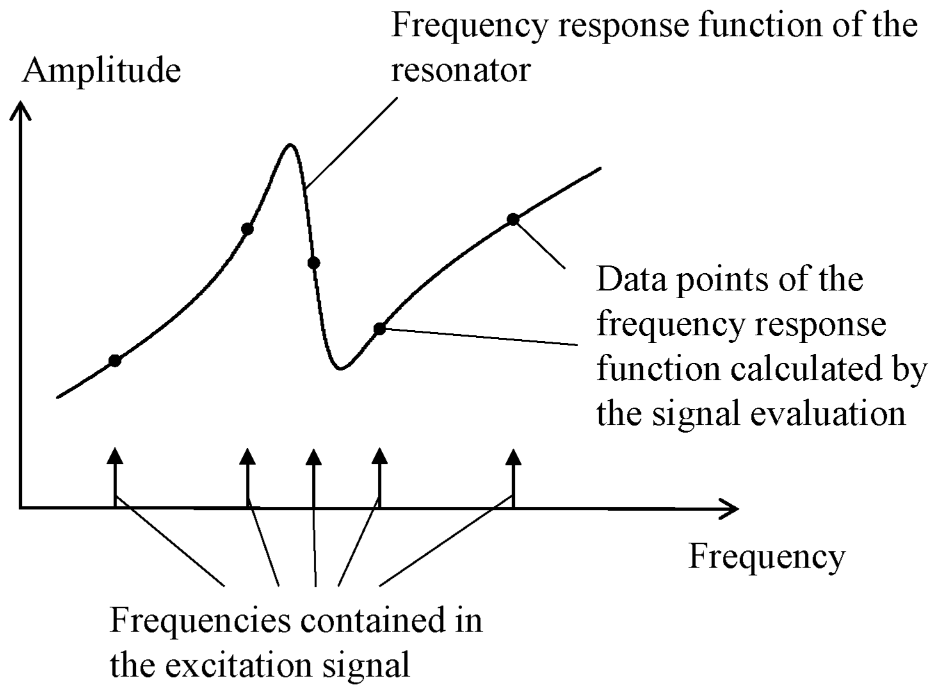
FIG. 4 illustrates excitation and response signal in the frequency domain according to an example of the invention.

The excitation signal comprises a countable number of different frequencies (FIG. 4). In order to adapt the signal to operating conditions and resonator properties, these components of the signal can be adjusted in frequency, amplitude, as well as phase. As the frequencies contained in the excitation signal are known, it is possible to separate them in the response signal without interactions. Consequently it is possible to determine the frequency response (or the complex impedance) of a resonator at the adjusted frequencies.

Figure 5:
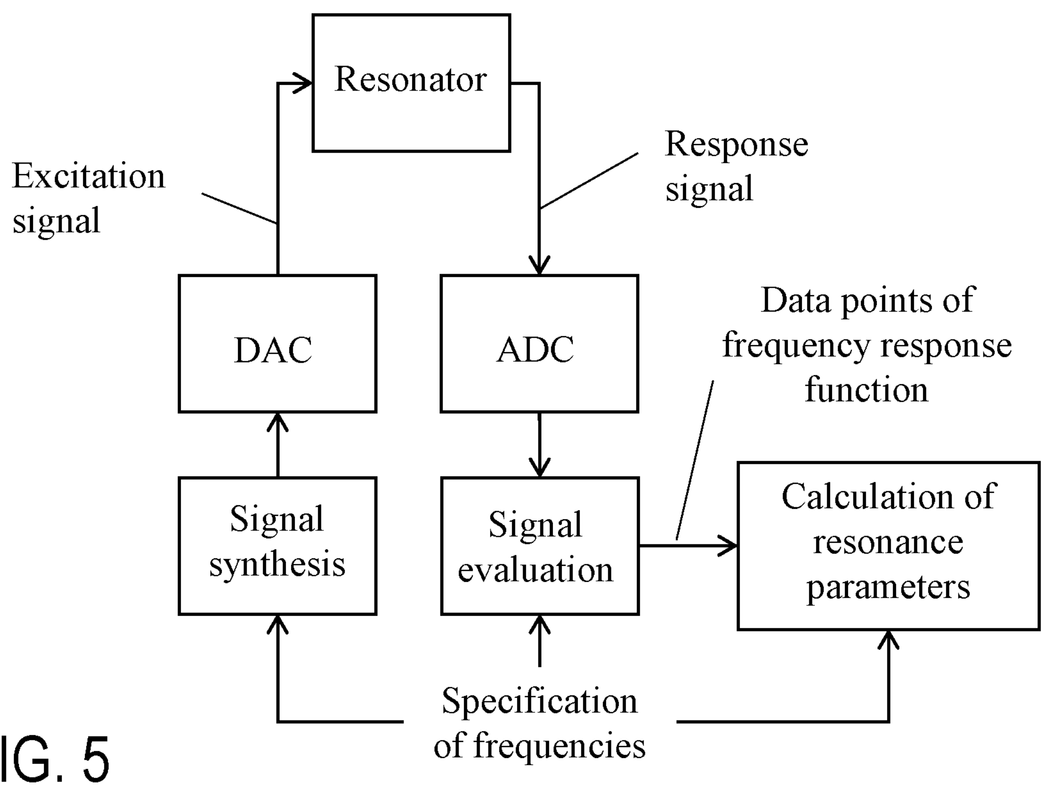
FIG. 5 illustrates a block diagram of the measurement setup according to an example of the invention.

FIG. 5 shows an example of generating the excitation signal and separating the frequency components in the response signal. In this example, the excitation signal with specified frequency components is synthesized by calculating it in the digital domain (for instance in a processor) and emitting it using a digital to analog converter (DAC). The separation of the response signal can be achieved by sampling the continuous-time signal with an analog to digital converter (ADC) with a sampling rate of $f_T=1/T$, where T is the time between two consecutive samples, where the sampling rate has to meet the Nyquist-Shannon sampling theorem. The resulting discrete-time signal is then a sequence $[n]=A(n\cdot T)$, where $n\in\mathbb{N}$ is the index of the sequence.

For a number of K different frequencies $f_k$ (where $k=1\ldots K$) in the excitation signal, the system of linear equations $A[n]=\Sigma_k(a_k\cdot\cos(2\cdot\pi\cdot f_k\cdot n\cdot T)+b_k\cdot\sin(2\cdot\pi\cdot f_k\cdot n\cdot T))$, where the discrete-time response signal has at least 2K samples A[n], with $n=1\ldots N$, $N\geq 2K$, can be solved for the parameters $a_k$ and $b_k$. These parameters can be used to calculate the amplitude $\sqrt{a_k^2+b_k^2}$ and phase $\arctan(b_k/a_k)$ of each signal component in the response signal A[k].

If the frequencies of the signal components contained in the excitation signal are situated on a grid of r Hertz (causing the frequencies in the excitation signal being integer multiples of this fundamental frequency), the excitation and consequently the response signals have a periodicity of 1/r seconds. If in addition the sampling frequency is situated on the same grid ($f_T=i\cdot r, i\in\mathbb{N}$) the separation of the signal components can be performed using a discrete Fourier transform (DFT) with a block length of 1/r seconds (i samples). Optimized algorithms like the fast Fourier transform (FFT) or the Goertzel algorithm can be used for the computation of the DFT. Due to the fact that all components in the excitation signal and hence the excitation signal itself are periodic in the transformation window, no leakage effect and therefor no mutual influence of the signal components occurs.

With this method, the frequency response function of the sensor can be determined at a plurality of frequencies simultaneously. From the determined data points, the parameters of the resonator model are calculated (depending on the model this comprises quality factor, damping, spring constant, mass, capacitance, resistance, inductance, etc.).

By reducing the number of excited (and consequently evaluated) frequencies, the computational effort for the signal processing and for computing the parameters of the resonator model can be reduced. Nevertheless, a certain minimum number of different frequencies as well as certain requirements regarding their distribution may be required depending on the resonator model.

According to the outlined example of the invention, the frequency response function of a resonator is determined at a finite number of at least two frequencies, where the excitation signal is a stationary signal, so that the resonator is operated in steady-state and no transient behavior is caused by excitation and evaluation of the resonator.

One important application of resonant sensors is the measurement of viscosity and density of fluids. The sensor usually comprises an electromechanical resonator (such as a piezoelectric or an electrodynamic resonator). When exposed to a fluid the resonator changes its resonant behavior (resonance frequency and quality factor) depending on the viscosity and density of the fluid. With the described method, the resonant behavior of the sensor can be evaluated in a fast and simple way. The density and viscosity of the liquid can be calculated from the acquired data. Even if the frequency transfer function of the sensor is evaluated only at a few different frequencies, the complete resonance curve and therefor the parameters of the resonator can be calculated by means of the electromechanical (parametric) model for the resonator.

What is claimed is:

1. A method for operating a resonator, the method comprising:

exciting the resonator by means of a periodic excitation signal with an integer number of at least two signal components with one preselected specified frequency each;

determining a response signal of the resonator at the preselected specified frequencies of the at least two signal components of the excitation signal, the response signal determined separately for each of the preselected specified frequencies; and calculating parameters of a resonator model based on the response signal.

2. The method of claim 1, where the excitation signal is a superposition of several sinusoidal signal components.

3. The method of claim 1, where the excitation signal is a current or a voltage fed to the resonator.

4. The method of claim 1, where the specified frequencies of the at least two signal components of the excitation signal are in each case an integer multiple of a fundamental frequency.

5. The method of claim 1, wherein determining the response signal of the resonator comprises:

sampling the response signal produced by the resonator, the response signal comprising several signal components at the specified frequencies; and calculating amplitude and phase or real and imaginary parts of the response signal at the specified frequencies.

6. The method of claim 1, wherein determining the response signal of the resonator comprises:

sampling the response signal produced by the resonator, the response signal comprising several signal components at the specified frequencies;

calculating amplitude and phase or real and imaginary parts of the response signal at the specified frequencies; and calculating a resonator impedance at the specified frequencies of the signal components of the excitation signal and of the response signal.

7. The method of claim 1, wherein the preselected specified frequencies are independent from a resonance frequency of the resonator.

8. The method of claim 1, wherein the preselected specified frequencies comprise a fixed set of harmonics composing the periodic excitation signal.

9. The method of claim 1, wherein the response signal is determined by exclusively evaluating an integer number of frequency values.

10. The method of claim 9, wherein the integer number of frequency values consist of each of the preselected specified frequencies.

11. A measurement apparatus, comprising:

a resonator; and a signal processing device coupled with the resonator, the signal processing device being operable to:

excite the resonator by means of a periodic excitation signal with an integer number of at least two signal components with one preselected specified frequency each;

determine a response signal of the resonator at the preselected specified frequencies of the at least two signal components of the excitation signal, the response signal determined separately for each of the preselected specified frequencies; and calculate parameters of a resonator model based on the response signal.

12. The measurement apparatus of claim 11, wherein the signal processing device comprises a sampling unit operable to sample the response signal produced by the resonator, the response signal comprising several signal components at the specified frequencies, and wherein the signal processing device further comprises a processor operable to calculate amplitude and phase or real and imaginary parts of the response signal at the specified frequencies.

13. The measurement apparatus of claim 11, wherein the signal processing device comprises a sampling unit operable to sample the response signal produced by the resonator, the response signal comprising several signal components at the specified frequencies, and wherein the signal processing device further comprises a processor operable to calculate amplitude and phase or real and imaginary parts of the response signal for the specified frequencies and a resonator impedance at the specified frequencies of the signal components of the excitation signal and of the response signal.

14. The measurement apparatus of claim 11, wherein the signal processing device is operable to determine the response signal by exclusively evaluating an integer number of frequency values.

15. The measurement apparatus of claim 14, wherein the integer number of frequency values consist of each of the preselected specified frequencies.

16. A method of measuring measure viscosity and/or density of a fluid using a resonator exposed to the fluid, the method comprising:

exciting the resonator by means of a periodic excitation signal with an integer number of at least two signal components with one preselected specified frequency each;

determining a response signal of the resonator at the preselected specified frequencies of the at least two signal components of the excitation signal, the response signal determined separately for each of the preselected specified frequencies;

calculating parameters of a resonator model based on the response signal; and calculating the viscosity and/or density of the fluid from the parameters of the resonator model.

17. The method of claim 16, wherein the response signal is determined by exclusively evaluating an integer number of frequency values.

18. The method of claim 17, wherein the integer number of frequency values consist of each of the preselected specified frequencies.

* * * * *